(12) United States Patent
Katakwar et al.

(10) Patent No.: US 10,880,042 B1
(45) Date of Patent: Dec. 29, 2020

(54) SERIAL DATA RECEIVER WITH DECISION FEEDBACK EQUALIZATION

(71) Applicant: Apple Inc., Cupertino, CA (US)

(72) Inventors: Mitesh D. Katakwar, San Jose, CA (US); Seong Hoon Lee, San Jose, CA (US); Huy M. Nguyen, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/871,864

(22) Filed: May 11, 2020

Related U.S. Application Data

(63) Continuation of application No. 16/431,482, filed on Jun. 4, 2019, now Pat. No. 10,651,979.

(51) Int. Cl.
| | | |
|---|---|---|
| *H04L 1/06* | (2006.01) | |
| *H03K 19/00* | (2006.01) | |
| *H04L 25/03* | (2006.01) | |

(52) U.S. Cl.
CPC ....... *H04L 1/0643* (2013.01); *H03K 19/0005* (2013.01); *H04L 25/03343* (2013.01); *H04L 2025/0349* (2013.01)

(58) Field of Classification Search
CPC ............. H04L 1/0643; H04L 25/03949; H04L 25/03267; H03K 19/0005
See application file for complete search history.

(56) References Cited

U.S. PATENT DOCUMENTS

| | | |
|---|---|---|
| 10,135,643 B1 | 11/2018 | Kong et al. |
| 2008/0279310 A1* | 11/2008 | Wu ............... H04L 25/0264 375/318 |
| 2015/0103876 A1 | 4/2015 | Amirkhany et al. |

FOREIGN PATENT DOCUMENTS

WO          19055894          3/2019

* cited by examiner

*Primary Examiner* — Curtis B Odom
(74) *Attorney, Agent, or Firm* — Kowert, Hood, Munyon, Rankin & Goetzel, P.C.

(57) ABSTRACT

An apparatus includes first and second receiver circuits and a decision circuit. The first receiver circuit is configured to generate a first data symbol from a particular input data symbol of a plurality of input data symbols included in an input signal. The second receiver circuit is configured to generate a second data symbol from the particular input data symbol. The decision circuit is configured to select, using respective values of one or more previous output data symbols, either the first or second data symbol as a current output data symbol. In response to a change in value between successive input data symbols, the first and second receiver circuits are configured to generate the first and second data symbols with respective data valid windows with different durations.

20 Claims, 9 Drawing Sheets

US 10,880,042 B1

SERIAL DATA RECEIVER WITH DECISION FEEDBACK EQUALIZATION

The present application is a continuation of U.S. application Ser. No. 16/431,482, filed Jun. 4, 2019 (now U.S. Pat. No. 10,651,979); the disclosure of which is incorporated by reference herein in its entirety.

BACKGROUND

Technical Field

Embodiments described herein are related to the field of integrated circuits, and more particularly to serial communication circuits in an integrated circuit.

Description of the Related Art

A computer system or integrated circuit, such as a system-on-a-chip (SoC), may include one or more interfaces for communication with other ICs. For example, an SoC may include a double-data rate (DDR) interface for communicating with a dynamic random-access memory (DRAM) module. As access times may directly impact performance of an SoC, there is a desire to transfer data between the SoC and the DRAM module as quickly as possible. DDR interfaces may, therefore, be designed for high data transfer frequencies.

In combination with a desire for high performance computer systems, prevalence of mobile computing devices drives a desire for lower power computing systems, including low power DDR interfaces that operate at lower voltage levels. In order to receive high-speed/low voltage signals, a differential amplifier may be employed. A differential amplifier used to receive signals from a DDR DRAM module may also utilize a bias voltage generator as well as a reference voltage generator. Such circuits, however, may consume an undesirable amount of power, resulting in reduced battery life in a mobile computing device.

SUMMARY OF THE EMBODIMENTS

Broadly speaking, a system, an apparatus, and a method are contemplated in which the apparatus includes first and second receiver circuits and a decision circuit. The first receiver circuit may be configured to generate a first data symbol from a particular input data symbol of a plurality of input data symbols included in an input signal. The second receiver circuit may be configured to generate a second data symbol from the particular input data symbol. The decision circuit may be configured to select, using respective values of one or more previous output data symbols, either the first or second data symbol as a current output data symbol. In response to a change in value between successive input data symbols, the first and second receiver circuits may be configured to generate the first and second data symbols with respective data valid windows with different durations.

In a further example, to generate the first data symbol, the first receiver circuit may have a first input voltage trip point that is lower than a second input voltage trip point of the second receiver circuit. In one example, to set the first input voltage trip point, the first receiver circuit includes a first plurality of transconductance devices coupled between a first output node and a ground reference node. In another example, to set the second input voltage trip point, the second receiver circuit may include a second plurality of transconductance devices coupled between a second output node and a power signal.

In an embodiment, the first and second receiver circuits may be further configured to enable a respective one of the first and second pluralities of transconductance devices based on a control signal such that, when the control signal is asserted, the first input voltage trip point is decreased and the second input voltage trip point is increased. In one example, the first and second receiver circuits may be further configured to generate the first and second data symbols such that a data valid window is longer for the first data symbol than for the second data symbol when the input signal transitions from a logic low to a logic high, and the data valid window is longer for the second data symbol than for the first data symbol when the input signal transitions from a logic high to a logic low.

BRIEF DESCRIPTION OF THE DRAWINGS

The following detailed description makes reference to the accompanying drawings, which are now briefly described.

Figure 1:
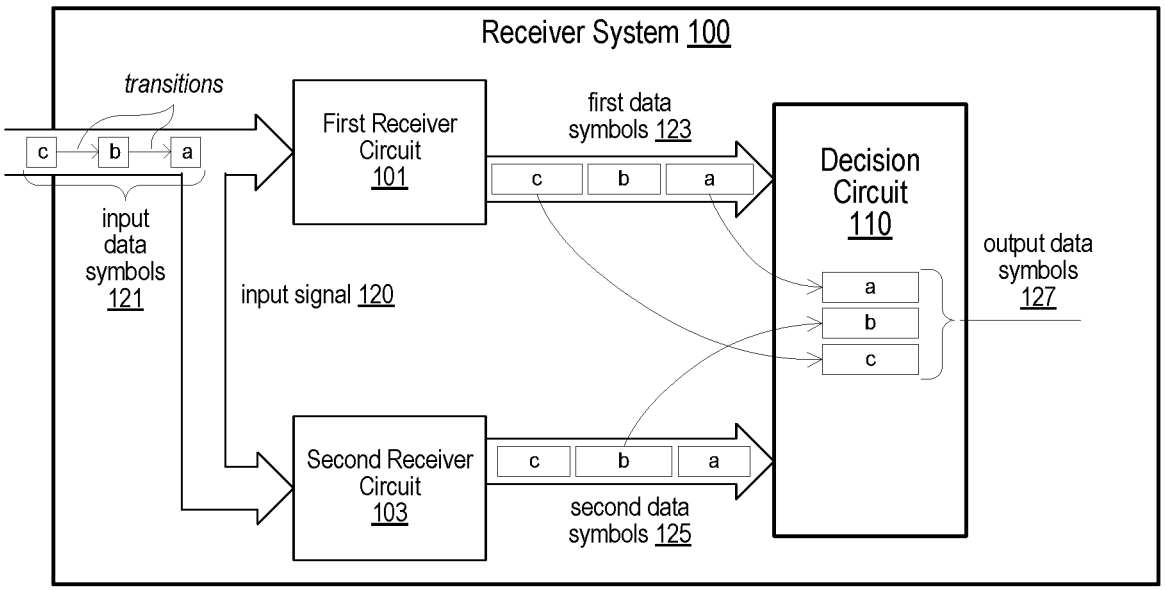
FIG. 1 illustrates a block diagram of an embodiment of a receiver system.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

High-speed serial communication circuits may be utilized in an integrated circuit (IC) for a variety of interfaces, such as, Ethernet, universal serial bus (USB), serial AT attachment (SATA), and double-data rate (DDR) interfaces. In some designs, multiple serial communication circuits may be utilized in parallel to further increase data transfer speeds by sending one bit of a data word (referred to herein as a data symbol) via each serial communication circuit.

To improve data rates for high-speed serial data communication across a communication channel, decision feedback equalization (DFE) may be implemented in serial receiver circuits to attenuate lasting effects from previously received data symbols as well as effects from the physical properties of the communication channel itself. Various characteristics of a connection between a transmitter circuit and a receiver circuit, for example, a length of a wire, an impedance of the wire, electromagnetic coupling to other nearby wires, and the like, may determine an amount of influence previous data symbols have on a current data symbol. For example, a logic high data symbol, represented on a wire as a high voltage level, may cause a subsequent logic low data symbol, represented on the wire by a low voltage level, to have a higher voltage level than if the first data symbol was a logic low. In various cases, the influence of the voltage level of a given data symbol may persist on the wire one, two, or more subsequent data symbols.

To mitigate bit errors that may occur due to the physical characteristics of a communication channel, some communication systems may use differential amplifiers to receive an input signal and generate a stream of data symbols based on the input signal. In addition, these communication systems may also utilize a bias voltage generator as well as a reference voltage generator in combination with the differential amplifiers. These differential amplifiers may consume a relatively high amount of power, and may have increasing bit error rates as data rates increase. A reduced-power option with improved bit error rates is, therefore, desired.

Embodiments of apparatus and methods are presented for receiving a serial data input signal. The apparatus includes at least two receiver circuits. A first receiver circuit is configured to extend a data valid window of first data symbol in response to detecting a particular state on the input signal. A second receiver circuit is configured to extend a data valid window of second data symbol in response to detecting a different state on the input signal. The data symbols from the first and second receivers are received by a decision circuit which selects one of the two received data symbols based on at least one previously determined output data symbols, and uses the selected data symbol to determine a next output data symbol. Use of such an apparatus may improve data valid windows sampled from a received input signal, for example, by increasing a width of an effective data eye of the received input signal. These improved data windows may be capable of supporting faster data transfer rates and/or lower voltage levels on input signal with little or no increase in bit error rates.

A block diagram for an embodiment of a receiver system is illustrated in FIG. 1. Receiver system 100 may be included in an integrated circuit (IC) as part of a communication interface, for example a memory interface such as LPDDR3, LPDDR4, Wide I/O n, and High Bandwidth Memory (HBM). Receiver system 100 may, therefore, represent a receiver channel for one serial bitstream of a plurality of bitstreams that combined form a data word. In various embodiments, receiver system 100 may be used to communicate with an IC in another package, an IC on another die in a same package, or other circuits within a same IC. As illustrated, receiver system includes first receiver circuit 101 and second receiver circuit 103, both coupled to decision circuit 110.

Input signal 120 is received by receiver system 100 and sent to both first receiver circuit 101 and second receiver circuit 103. First receiver circuit 101, as shown, is configured to generate first data symbols 123 from respective ones of input data symbols 121 included in input signal 120. In a similar manner, second receiver circuit 103 is configured to generate second data symbols 125 from respective ones of input data symbols 121. First receiver circuit 101 and second receiver circuit 103 are further configured to generate first data symbols 123 and second data symbols 125 such that a data valid window is longer for a given first data symbol than for a corresponding second data symbol when input signal 120 transitions from one logic state to another. Similarly, a data valid window is longer for a given second data symbol than for a corresponding first data symbol when a different logic transition occurs on input signal 120.

As used herein, a "data symbol" refers to a particular voltage level at an input node that represents a respective value for one or more bits of information. In some embodiments, one bit may be represented by a voltage level on a single node such that a voltage level above a threshold voltage level corresponds to a logic high value, or a '1' and a voltage level below the threshold voltage level corresponds to a logic low value, or a '0.' In other embodiments, a pair of input nodes may be used to receive two input signals to determine a value of a single bit, such as a differential signal. Differential signaling uses different voltage levels in a data symbol to determine a data value. For example, when a first voltage level of a first input node is above the threshold voltage and a second voltage level of a second input node is below the threshold voltage, then the bit has a logic high value and vice versa. If the voltage level on both input nodes is above or below the threshold level, then the data is invalid.

Decision circuit 110, is configured to select a particular data symbol from either first data symbols 123 or second data symbols 125 as a corresponding one of output data symbols 127. To select a given data symbol from either first data symbols 123 or second data symbols 125, decision circuit 110 uses respective values of one or more previous data symbols from output data symbols 127. Use of previously selected data symbols to select a current data symbol is referred to herein as decision feedback equalization (DFE). DFE is based on the knowledge that a current voltage level of an input node may be influenced by a previous voltage level on the input node. As previously described, characteristics of a connection between a transmitter circuit and a receiver circuit may determine an amount of influence one or more previously received data symbols have on a current data symbol.

For example, input signals 120 may include input data symbols 121a, 121b, and 121c. In this example, input data symbols 121 have one of two logic states, logic high and logic low, each logic state corresponding to a particular state of a particular characteristic of input signal 120 (the particular state being, for example, a voltage level or an amount of current). In other embodiments, however, additional logic states may be included by using additional voltage levels and/or differential signaling. When sequential data symbols encode different logic states (or values), a transition of the voltage level on the input signal may occur between the sequential data symbols. For example, a first voltage level transition occurs between input data symbols 121a and 121b, and a second voltage level transition occurs between input data symbols 121b and 121c. As shown, first receiver circuit 101 generates wider data symbols for input data symbols 121a and 121c, while second receiver circuit generates a wider data symbol for input data symbol 121b. If, however, several consecutive data symbols have a same value (i.e., no transition occurs before and after a particular data symbol), then both first receiver circuit 101 and second receiver circuit 103 may generate respective first and second data symbols that are a same length. Valid data windows may be increased when transitions occur on input signal 120.

Based on data values for previously received data symbols, decision circuit 110 may select a data symbol from first receiver circuit 101 (e.g., first data symbol 123c) if a value for a previous output data symbol 127 (e.g., output data symbol 127b) indicates that input data symbol 121b will tend to pull input signal 120 to a first voltage level. In a similar manner, decision circuit 110 may select a data symbol from second receiver circuit 103 (e.g., second data symbol 125b) if a value for a previous output data symbol 127 (e.g., output data symbol 127a) indicates that input data symbol 121a will tend to pull input signal 120 to a second voltage level.

Put differently, decision circuit 110 may determine that the voltage level of the input node may be skewed to the second voltage level, based on a data value of output data symbol 127a. In response to this determination, second data symbol 125b is selected from second data symbols 125 to compensate for the skew to the second voltage level, thereby increasing a data valid window if input data symbol 121b transitions. If, however, input data symbol 121b does not transition, then second data symbol 125b will remain in a same logic state as second data symbol 125a. When a signal transition occurs on input signal 120 that may be hindered by effects from previous data symbols, decision circuit 110 is configured to select a data symbol that is valid for a longer time period. A longer data valid window may increase an amount of time for sampling circuits in receiver system 100 to detect the correct value of the data symbol. Shorter data valid windows, therefore, may result in higher bit error rates as timing for a data strobe may be more difficult to set with the shorter data valid windows.

As used herein, a "data valid window" refers to an amount of time that a characteristic of an input signal reaches and remains in a particular state that corresponds to a particular value of a data symbol. For example, if a high voltage level corresponds to a logic high data value, then the data valid window for a given data symbol is an amount of time that the voltage level of the input signal remains above a threshold voltage for detecting a logic high voltage. If a logic high data value occurs on three successive data symbols, then the middle data symbol may have a data valid window that spans an entire length of the data symbol. In contrast, if the second data symbol has logic low data value while the first and third data symbols have logic high data values, then the data valid window may be reduced by an amount of time that the voltage level of the input signal spends in transition between the high voltage level and the threshold voltage for detecting a logic low voltage level.

It is noted that receiver system 100 as illustrated in FIG. 1 is merely an example. The illustration of FIG. 1 has been simplified to highlight features relevant to this disclosure. Various embodiments may include different configurations of the circuit blocks, including additional circuit blocks, such as, for example, additional power sampling circuits.

Figure 2:
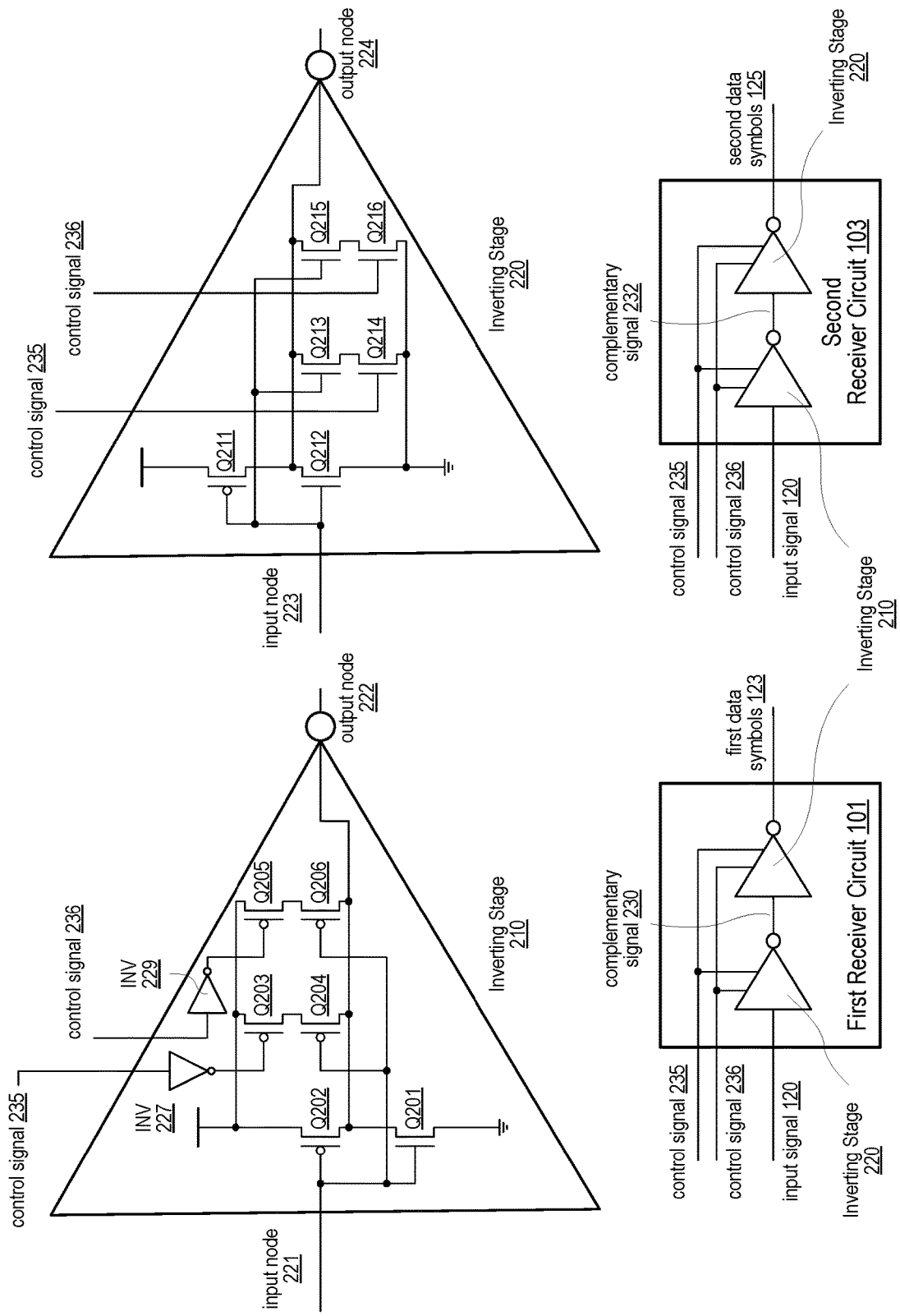
FIG. 2 shows two circuit diagram of embodiments of inverting stages used in a receiver circuit.

The receiver system illustrated in FIG. 1 is shown with two receiver circuits. These receiver circuits may be implemented according to various design techniques. A particular example of such a design are shown in FIG. 2. As illustrated, embodiments of inverting stages that may be used in receiver circuits are shown. Inverting stage 210 includes six transconductance devices, Q201-Q206 and inverter circuits (INV) 227 and 229. An input signal is received on input node 221 and an output signal is generated on output node 222. Inverting stage 220 also includes six transconductance devices, Q211-Q216, and receives an input signal on input node 223 and generates an output signal on output node 224. Embodiments of first receiver circuit 101 and second receiver circuit 103 are illustrated that include arrangements of inverting stage 210 and inverting stage 220.

In order to adjust durations of valid windows, first and second receiver circuits 101 and 103 may employ various techniques. For example, these receiver circuits may employ different trip points. Raising a level of a trip point may increase a length of logic low data valid windows and decrease a length of logic high data valid windows, and vice versa when lowering a level of a trip point.

As illustrated, first and second receiver circuits 101 and 103 receive input signal 120 and are configured to generate a logic high output when a voltage level of input signal 120 is greater than their respective trip points, and generate a logic low when a voltage level of input signal 120 is less than their respective trip points. On their respective input nodes, first receiver circuit 101 uses a first trip point level that is lower than a second trip point level used by second receiver circuit 103. First receiver circuit 101 uses inverting stage 220 as a first inverting stage, followed by inverting stage 210 as a second inverting stage. Second receiver circuit 103 is the opposite, using inverting stage 210 as a first inverting stage, followed by inverting stage 220 as a second inverting stage. The respective first and second trip point levels are determined by the respective first inverting stages, the first trip point level determined by inverting stage 220 and the second trip point level determined by inverting stage

210. Additional details of how a trip point level may affect a valid data window are provided below in the descriptions of FIGS. 3 and 4.

Inverting stage 210 generates a voltage on output node 222 with a logic voltage level that is complementary to the voltage level on input node 221. While the voltage level on input node 221 is above the second trip point, inverting stage 210 generates a logic low voltage level on output node 222, and conversely, generates a logic high voltage level on output node 222 while the voltage level on input node 221 is below the second trip point. To set the second trip point, inverting stage 210, as shown, includes a plurality of p-channel metal-oxide-semiconductor (PMOS) transistors (Q202-Q206) coupled between output node 222 and a ground reference node, and a n-channel metal-oxide-semiconductor (NMOS) transistor (Q201) coupled between output node 222 and a power node. Although NMOS and PMOS transistors are used in the illustrated embodiment, in other embodiments, any suitable type of complementary transconductance devices may be used.

Q201 and Q202 are coupled to form an inverter circuit. If Q203-Q206 are ignored, then the circuit formed by Q201 and Q202 will generate the complement of the logic level on input node 221 on output node 222. The NMOS Q201 conducts an increasing amount of current between output node 222 and the ground reference node as the voltage level on input node 221 increases towards a threshold voltage of Q201. The PMOS Q202 conducts an increasing amount of current between the power node and output node 222 as the voltage level on input node 221 decreases towards a threshold voltage of Q202. If Q201 and Q202 are similarly sized, then the second trip point level may be approximately equal to one-half of the power node voltage level.

The addition of Q204 and Q206 adjust the second trip point to a lower voltage level by increasing a current between output node 222 and the power node by increasing a number of current paths. Assuming that Q202, Q204 and Q206 are similarly sized, then the amount of current that is conducted between the power node and output node 222 is tripled for a same voltage level on input node 221. To allow for an adjustable first trip point, Q203 and Q205 are added to selectively enable the current paths through Q204 and Q206, respectively. Control signals 235 and 236, respectively, determine if Q203 and Q205 are on, resulting in the corresponding path through Q204 and Q206 to be enabled.

When control signals 235 and 236 are de-asserted (logic low), the control terminals of Q203 and Q205 are driven high by inverter circuits (INV) 227 and 229, respectively. The high logic levels from INVs 227 and 229 are above the threshold voltages for Q203 and Q205, disabling them and thereby blocking current flow through Q204 and Q206. Inverting stage 210 may be configured for a lowest one of its possible trip points with control signals 235 and 236 de-asserted. Asserting control signal 235 results in a logic low being applied to the control gate of Q203 by INV 227, thereby turning Q203 on and enabling current to flow through Q204 based on the voltage level on input node 221. Inverting stage 210 now has two PMOS transistors providing current paths from output node 222 to the power node while Q201 provides the only current path from output node 222 to the ground reference node. The level of the second trip point is thereby increased due to the increased ability of inverting stage 210 to source current from the power node to output node 222, as compared the ability to sink current from output node 222 to the ground reference node. Asserting control signal 236 instead of control signal 235 may result in a similar level of the second trip point. Asserting both control signals 235 and 236 provides three paths from the power node to output node 222, thereby further increasing the level of the second trip point.

Inverting stage 220 is similar to inverting stage 210, except that the logic is reversed, resulting in a decreased first trip point when control signals 235 and/or 236 are asserted. Inverting stage 220 is configured to generate a logic voltage level that is complementary to a logic level detected on input node 223. In a similar manner as inverting stage 210, inverting stage 220 generates a logic low voltage level on output node 224 when the voltage level on input node 223 is above the first trip point. Inverting stage 220 generates a logic high voltage level on output node 224 when the voltage level on input node 223 is below the first trip point.

To set the first trip point, inverting stage 220, as illustrated, includes a plurality of NMOS transistors (Q212-Q216) coupled between output node 224 and the ground reference node, and a PMOS transistor (Q211) coupled between output node 224 and the power node. Q211 and Q212 are coupled to form an inverter circuit similar to Q201 and Q202. Q213 and Q215 are included to adjust the first trip point to a higher voltage level by increasing a current between output node 224 and the ground reference node by increasing a number of current paths. Assuming that Q212, Q213 and Q215 have similar properties, then the amount of current that is conducted between output node 224 and the ground reference node is tripled for a same voltage level on input node 223.

Q214 and Q216 are added to selectively enable the current paths through Q213 and Q215, respectively, allowing for the first trip point to be adjusted. Control signals 235 and 236, respectively, determine if Q214 and Q216 are on, resulting in the corresponding path through Q213 and Q215 to be enabled. As described above for inverting stage 210, control signals 235 and 236 may be selectively asserted to adjust the first trip point from a highest setting (control signals 235 and 236 both de-asserted) to a lowest setting (control signals 235 and 236 both asserted). With one of control signals 235 and 236 asserted, the second trip point of inverting stage 210 may have a higher voltage level than the first trip point of inverting stage 220.

As illustrated, first receiver circuit 101 and second receiver circuit 103 each include one instance of inverting stage 210 and inverting stage 220. Since both inverting stages 210 and 220 generate complemented outputs of their respective inputs, first and second data symbols 123 and 125 are generated with logic states that correspond to detected logic levels of input signal 120.

In first receiver circuit 101, inverting stage 220 receives input signal 120, and generates complementary signal 230 based on determined voltage levels of input signal 120. Inverting stage 220 sends complementary signal 230 to inverting stage 210. Inverting stage 210 generates first data symbols 123 based on the detected logic level of complementary signal 230. The lower trip point of inverting stage 220 may enable first receiver circuit 101 to detect a rising transition of input signal 120 faster than inverting stage 210 can detect the rising transition. Since complementary signal 230 has a falling transition in response to the rising transition of input signal 120, the higher trip point of inverting stage 210 may detect this falling transition faster than inverting stage 220. These trip point levels may result in first receiver circuit 101 generating first data symbols 123 that have longer data valid windows when input signal 120 transitions from a logic low to a logic high in comparison with transitions from a logic high to a logic low.

In second receiver circuit 103, inverting stage 210 receives input signal 120, and generates complementary signal 232 based on determined voltage levels of input signal 120. Complementary signal 232 is sent to inverting stage 220 which generates second data symbols 125. The higher level of the second trip point of inverting stage 210 may enable second receiver circuit 103 to detect falling transitions of input signal 120 faster than inverting stage 220, resulting in second data symbols 125 having longer data valid windows when input signal 120 transitions from a logic high to a logic low in comparison with transitions from a logic low to a logic high.

Figure 3:
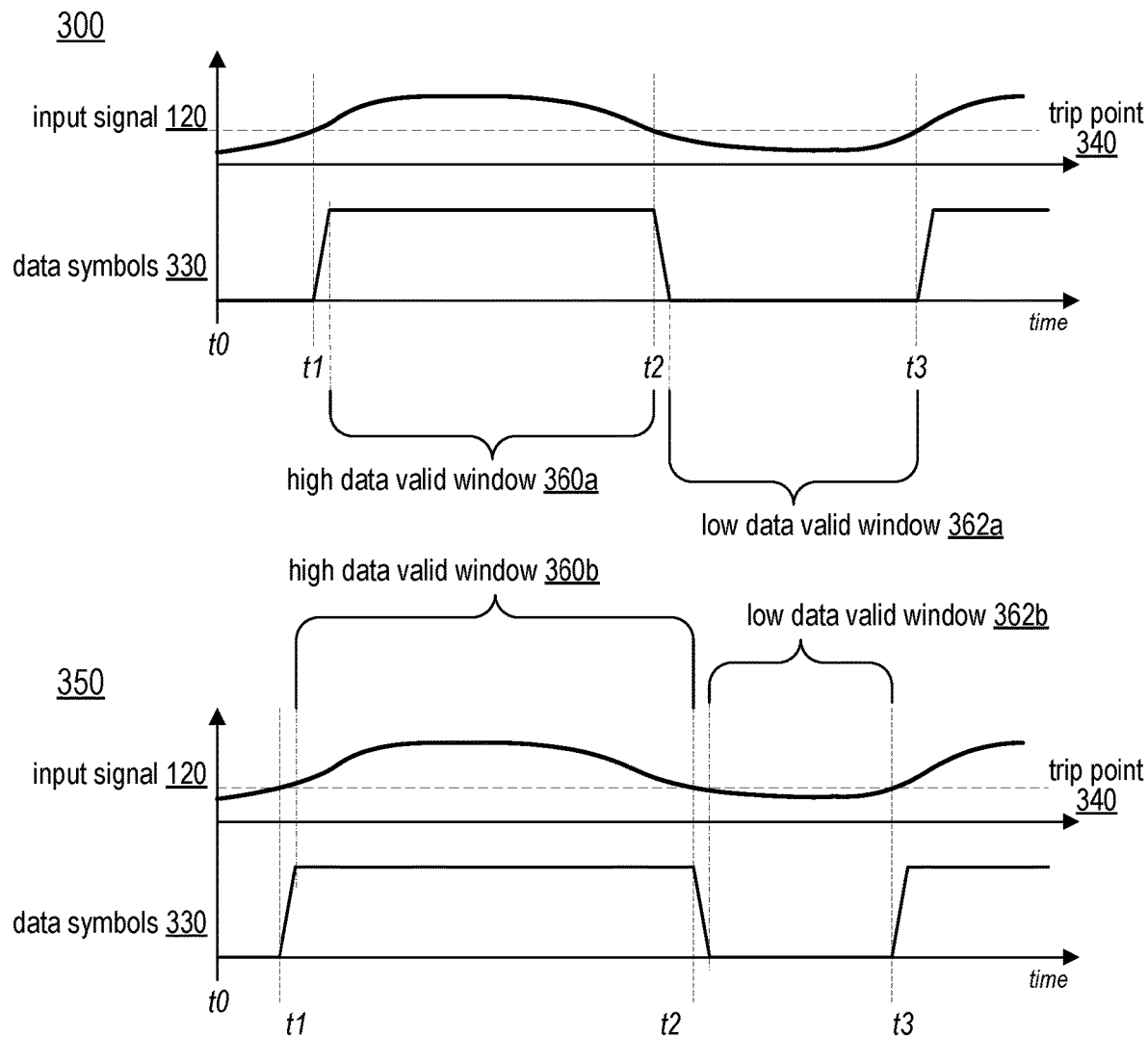
FIG. 3 depicts two charts of waveforms associated with an embodiment of a receiver system that utilizes a single input voltage trip point.
Figure 4:
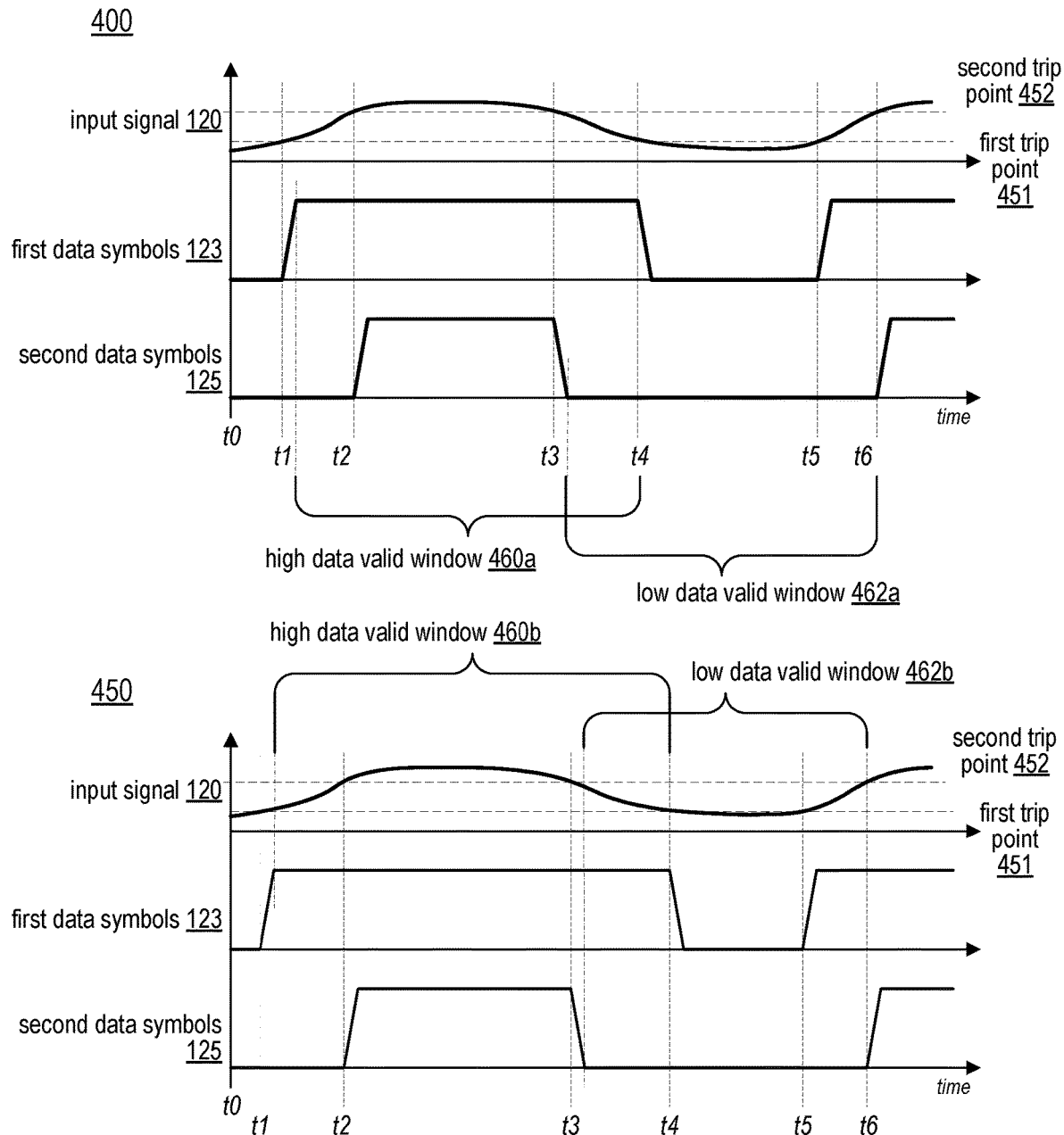
FIG. 4 illustrates two charts of waveforms associated with an embodiment of a receiver system that utilizes two input voltage trip points.

By adjusting the levels of the trip points of first and second receiver circuits 101 and 103, using circuits such as inverting stage 210 and inverting stage 220, data valid windows for first and second data symbols 123 and 125 may be adjusted. FIGS. 3 and 4, described below, illustrate how the trip points relate to the data valid windows.

Turning to FIG. 3, two charts that include waveforms associated with an embodiment of a receiver circuit are illustrated. Chart 300 illustrates waveforms for input signal 120 and data symbols 330 as associated with a receiver circuit, for example, first receiver circuit 101 or second receiver circuit 103 in FIGS. 1 and 2. Chart 350 depicts the same waveforms, except that voltage levels of input signal 120 are shifted higher by a DC offset. As discussed above, various properties of a communication channel between a transmitter circuit and a receiver circuit may affect a voltage level of an input signal being sent over the communication channel.

Input signal 120, as shown in charts 300 and 350, encodes a serial stream of input data symbols represented by high and low voltage levels. The shapes of input signal 120 are the same in both chart 300 and chart 350, except that in chart 350 a DC offset has been increased, causing the waveform to move slightly upward in respect to a ground reference node. To generate data symbols 330, a receiver circuit utilizes trip point 340, such as may be achieved by de-asserting both control signals 235 and 236 shown in FIG. 2. The receiver circuit generates data symbols 330 on an output node.

At time t0 in chart 300, the voltage level of input signal 120 is below the level of trip point 340. In response, data symbols 330 is at a logic low level. The level of input signal 120 is rising and, at time t1, reaches the level of trip point 340. In response, the receiver circuit begins to transition data symbols 330 from the logic low level to a logic high level. Between times t1 and t2, the voltage level of data symbols 330 reaches and then remains at a logic high level. This time period during which data symbols 330 may be successfully detected as a logic high is labeled as high data valid window 360a.

At time t2, the voltage level of input signal 120 falls back below the voltage level of trip point 340, causing the receiver circuit to transition data symbols 330 back to the logic low level. Between times t2 and t3, the voltage level of data symbols 330 reaches and then remains at the logic low level. This time period during which data symbols 330 can be successfully detected as a logic low is labeled as low data valid window 362a. At time t3, the voltage level of input signal 120 rises back above the level of trip point 340, resulting in another rising transition on data symbols 330.

Referring to chart 350, input signal 120 has been shifted to slightly higher voltage levels while trip point 340 remains at a same level as in chart 300. As previously stated, the shape of the waveform of input signal 120 is the same as in chart 300, the waveform is just shifted to a higher voltage offset. Chart 350 illustrates how this shift in the voltage level of input signal 120 may impact high and low data valid windows 360b and 362b. As in chart 300, the voltage level of input signal 120 is below trip point 340 at time t0, resulting in data symbols 330 being at the logic low level.

At time t1, the level of input signal 120 rises above trip point 340, causing the receiver circuit to transition data symbols 330 to the logic high level. It is noted that this transition to the logic high level occurs sooner in chart 350 than it does in chart 300. Since the voltage level of input signal 120 is shifted higher in chart 350, input signal 120 needs a smaller increase in the voltage level to reach trip point 340, resulting in trip point 340 being reached sooner. Data symbols 330 reaches and remains at the logic high level until the voltage level of input signal 120 falls back down to trip point 340, at which point data symbols 330 begins to transition back to the logic low level. Again, it is noted that this transition point is different than in chart 300. Shifting input signal 120 to a higher voltage offset results in a longer duration to high data valid window 360b as compared to high data valid window 360a in chart 300.

Between times t2 and t3, data symbols 330 reaches and then remains at the logic low level. In contrast to high data valid window 360b, low data valid window 362b has a shorter duration than low data valid window 362b in chart 300 due to the voltage shift of input signal 120. Data symbols 330 may be sampled using a data strobe asserted at a particular interval. When high data valid windows and low data valid windows have similar durations, a setting of the data strobe may result in few bit errors. When durations of the data valid windows are skewed to the high or low data valid windows, then more bit errors may be introduced, resulting in processing time lost to resending the data being transferred and/or performing error correction algorithms on the misread data.

Proceeding to FIG. 4, another two charts that include waveforms associated with an embodiment of a receiver circuit are illustrated. Chart 400 illustrates waveforms for input signal 120, first data symbols 123, and second data symbols 125 as associated with, for example, receiver system 100 in FIG. 1. Chart 450 depicts the same waveforms with a similar DC offset occurring on input signal 120 as is shown in FIG. 3. As shown in FIGS. 1 and 2, first data symbols 123 are generated by first receiver circuit 101, while second receiver circuit 103 generates second data symbols 125.

To generate first data symbols 123, first receiver circuit 101 utilizes first trip point 451 that is lower than second trip point 452 utilized by second receiver circuit 103. By using a lower input voltage trip point than second receiver circuit 103, first receiver circuit 101 will detect a rising transition, from a logic low to a logic high, of input signal 120 before second receiver circuit 103.

Referring to chart 400, the voltage level of input signal 120 is below both trip points 451 and 452 at time t0, resulting in both first data symbols 123 and second data symbols 125 being at logic low levels. The rising voltage level of input signal 120 reaches the lower voltage of trip point 451 at time t1 before reaching the higher voltage of second trip point 452 at time t2. Accordingly, first data symbols 123 transitions to the logic high level at time t1 before second data symbols 125 transitions to the logic high level, at time t2. As the voltage level of input signal 120 falls, second trip point 452 is reached at time t3 before reaching first trip point 451 at time t4. Second data symbols 125, therefore, transitions back to the logic low level at time t3 before first data symbols 123 transitions at time t4. The lower level of first trip point 451 results in high data valid window 460a for first data symbols 123 being longer than the high data valid window for second data symbols 125. Decision circuit 110 may select high data valid window 460a of first data symbols 123 as one of output data symbols 127, shown in FIG. 1.

First data symbols 123 remains at the logic low level until input signal 120 reaches first trip point 451 at time t5, while second data symbols 125 remains at the logic low level longer, until time t6 when input signal 120 reaches second trip point 452. Accordingly, the higher voltage level of second trip point 452 results in low data valid window 462a for second data symbols 125 being longer than the low data valid window for first data symbols 123. Decision circuit 110 may, therefore, select low data valid window 462a of second data symbols 125 as a subsequent one of output data symbols 127. The waveforms of chart 400 demonstrate an example of how first receiver circuit 101 and second receiver circuit 103, using different trip points, may generate data symbols with different lengths based on the same input signal 120.

It is noted that, unlike high data valid window 360a and low data valid window 362a in FIG. 3, the durations of high data valid window 460a and low data valid window 462a overlap due to the use of first receiver circuit 101 and second receiver circuit 103. The amount of overlap may be adjusted based on the settings of first trip point 451 and second trip point 452. Decision circuit 110 may be configured to select high data valid window 460a before a data strobe triggers a sample of high data valid window 460a. Decision circuit 110 may then select low data valid window 462a before the data strobe triggers a sample of low data valid window 462a. The overlap between high data valid window 460a and low data valid window 462a may provide flexibility in when decision circuit 110 switches between the two data windows.

Chart 450 illustrates how a change in the voltage offset of input signal 120 impacts the high and low data valid windows. Input signal 120, as received, has a DC offset similar to what is illustrated in chart 350 of FIG. 3. Due to this shift, the voltage level of input signal 120 reaches first trip point 451 (at time t1) and second trip point 452 (at time t2) sooner than they were reached in chart 400. First data symbols 123 and second data symbols 125, therefore, transition from logic low levels to logic high levels sooner than in chart 400. The voltage offset further causes input signal 120 to return back to second trip point 452 (at time t3) and to first trip point 451 (at time t4) later than in chart 400. First and second data symbols 123 and 125 transition from the logic high to the logic low levels at time t3 and t4, respectively. Accordingly, high data valid window 460b for first data symbols 123 and the high data valid window for second data symbols 125 are longer than the corresponding data windows in chart 400.

The low data valid windows, however, are shorter than the corresponding data windows in chart 400. First data symbols 123 remains at the logic low level until input signal 120 reaches first trip point 451 at time t5, while second data symbols 125 remain at the logic low level until time t6 when input signal 120 reaches second trip point 452. Although low data valid window 462b in chart 450 is shorter than the corresponding low data valid window 462a in chart 400, the low data valid window 462b in chart 450 still overlaps with high data valid window 460b, and is longer than the corresponding low data valid window 362b in FIG. 3. Low data valid window 462b, therefore, may still be selected by decision circuit 110 and sampled in response to the data strobe while reducing a risk of incurring an increase in bit errors.

It is noted that the waveforms illustrated in FIGS. 3 and 4 are merely examples for demonstrating the disclosed concepts. In other embodiments, waveforms may exhibit noise caused by signal switching in nearby circuits, coupled to power supply signals from voltage regulators, or other known noise sources.

Receiver circuits and systems, as shown and describe in FIGS. 1-4 may be used in a variety of applications. For example, high-speed communication systems may be used to couple a mass-storage system (e.g., a hard-disk drive, a solid-state drive, or the like) to a computer system. High-speed communication systems may also be used to couple a computer system to a networking device such as a WiFi router or Ethernet hub. One application is depicted in FIG. 5.

Figure 5:
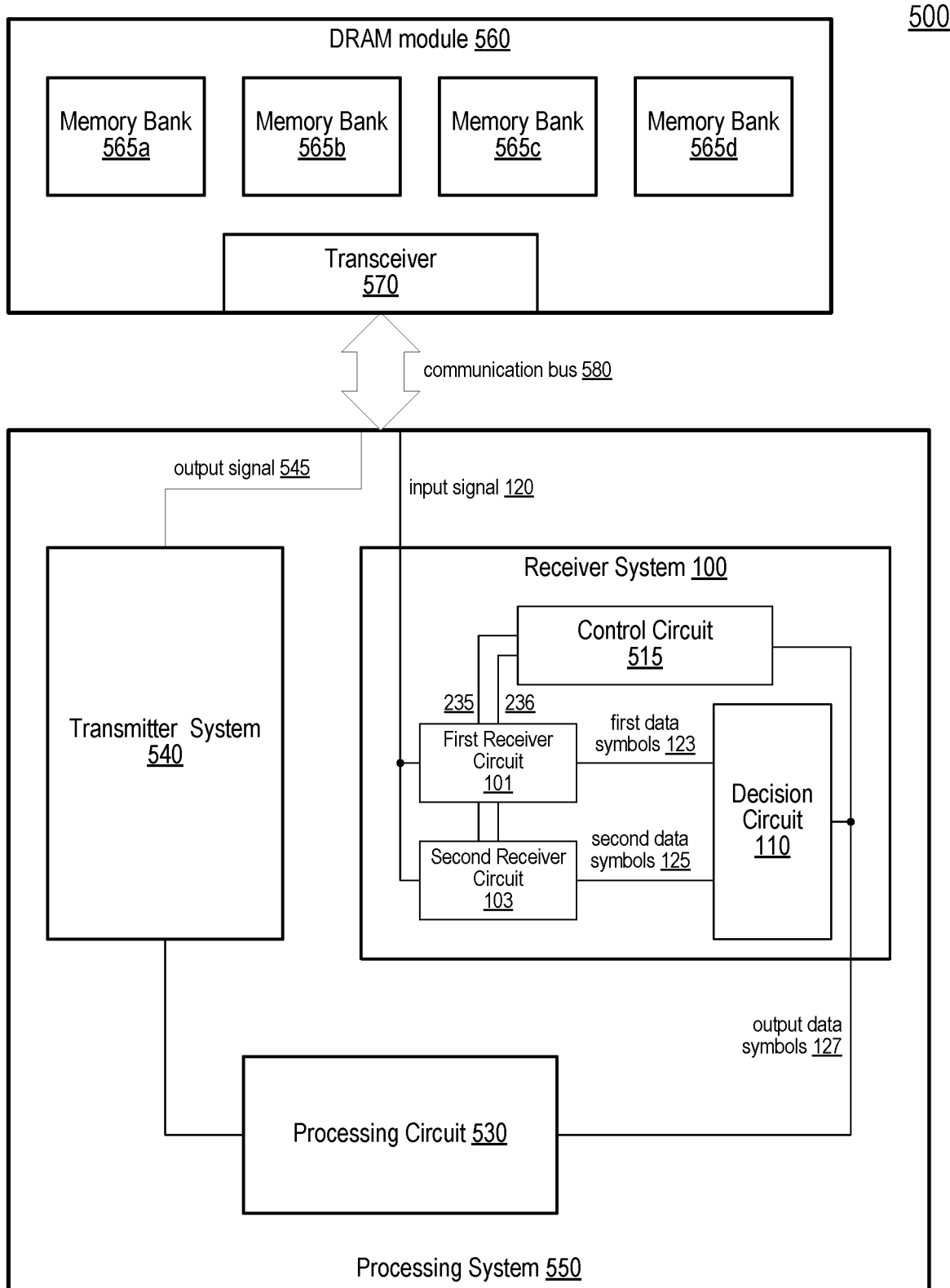
FIG. 5 depicts a block diagram of a computing system that utilizes the receiver system shown in FIG. 1.

Moving now to FIG. 5, a block diagram of an embodiment of a computing system that utilizes high-speed communication circuits is shown. Computing system 500 includes processing system 550 coupled to dynamic random-access memory (DRAM) module 560 via communication bus 580. Processing system 550 includes processing circuit 530 that accesses data in memory banks 565a-565d in DRAM module 560, using transmitter system 540 and receiver system 100 to communicate with transceiver 570 in DRAM module 560.

DRAM module 560 is a memory system that provides RAM storage for use by processing system 550. DRAM module 560 may support any suitable memory interface standard, such as LPDDR4, LPDDR4X, and LPDDR5, and the like. DRAM module 560 includes memory banks 565a-565d (collectively, memory banks 565). Each of memory banks 565 includes a particular amount of RAM cells used for storing information for processing system 550, such as program instructions and associated data. Access to memory banks 565 is provided through transceiver 570. Transceiver 570 is configured to receive memory requests from processing system 550 and fulfill these requests using memory banks 565.

Communication bus 580, in various embodiments, may include any suitable number of communication channels between DRAM module 560 and processing system 550. Each channel may further include any suitable number of wires for sending and receiving commands and data. For example, in one embodiment, communication bus 580 may be compliant with the LPDDR4 and, therefore include two 16-bit data buses and 6-bit command/address buses. Communication bus 580, in such an embodiment, includes at least 44 wires for transferring signals between processing system 550 and DRAM module 560.

Processing system 550 is configured to issue memory requests to DRAM module 560 to store information and access stored information in memory banks 565. Processing system 550, in various embodiments, may correspond to an integrated circuit (IC) such as a system-on-chip (SoC) or to a circuit board including a plurality of ICs. In some embodiments, processing system 550 may correspond to a memory interface configured to access one or more DRAM modules. Processing system 550 includes processing circuit 530 which may correspond to one or more processing cores in processing system 550 capable of issuing memory requests to DRAM module 560.

As illustrated, processing circuit 530 uses transmitter system 540 to send a memory request to transceiver 570 via communication bus 580 using output signal 545. The memory request is received by transceiver 570 and fulfilled using memory banks 565. If a response is required, e.g., information is being read from memory banks 565, then transceiver 570 returns the requested information via communication bus 580 to receiver system 100. Receiver system 100 receives the information on first receiver circuit 101 and second receiver circuit 103 using input signal 120. As disclosed, communication bus 580 may support a standard such as LPDDR4 or LPDDR5 and, therefore, may include a plurality of wires. The received information may be sent by transceiver 570 on a subset of this plurality of wires, such as a set of 16 wires comprising a 16-bit data bus within communication bus 580. To receive information from all 16 input signals, receiver system 100 includes sixteen or more sets of first receiver circuit 101, second receiver circuit 103, and decision circuit 110. For clarity, only one set is shown in FIG. 5. Operation of each set may conform to the descriptions disclosed above.

Wires included in communication bus 580 may, in some embodiments, include copper traces on one or more circuit boards, pins on one or more connectors and sockets, and/or wires in one or more cables. Physical properties of these various components that form communication bus 580 may differ from wire to wire, resulting in different transmission characteristics between the wires. These differing transmission characteristics may result in each wire having different amounts of symbol interference from previously received data symbols on a current data symbol being received.

To compensate for the differences between input signals received via different wires, first receiver circuit 101 and second receiver circuit 103 may include programmable trip points, as shown in FIG. 2 and described above. Control signals 235 and 236 are selectively asserted by control circuit 515 to set a particular trip point for first receiver circuit 101 and second receiver circuit 103. To determine a setting for the trip points of first receiver circuit 101 and second receiver circuit 103, control circuit 515 may initiate a training operation to detect symbol interference on at least some wires of communication bus 580.

In the example of FIG. 5, a training operation may begin with processing circuit 530 issuing one or more memory requests through transmitter system 540. These memory requests cause DRAM module 560 to return a particular data pattern known by control circuit 515. Based on how accurately data received by first receiver circuit 101 and second receiver circuit 103 matches the known data pattern, control circuit 515 may assert or de-assert control signals 235 and 236 until the received data achieves an acceptable level of accuracy to the known data pattern. Once the acceptable accuracy has been achieved, the training operation may be completed and normal operation of receiver system 100 may occur. In various embodiments, the training operation may be repeated periodically or in response to particular events, such as an assertion of a reset signal or a bit error rate reaching a particular threshold.

It is noted that the embodiment of FIG. 5 is merely one example to demonstrate the disclosed concepts. Computing system 500 is not intended to be limiting and other embodiments utilizing receiver system 100 are contemplated. For example, communication bus 580 may correspond to aerial interface cable and DRAM module 560 may be replaced with a network router.

FIGS. 1-5 illustrate block diagrams and waveforms associated with the disclosed concepts. Various methods may be employed to operate these disclosed circuits. Two such methods are discussed in regards to FIGS. 6 and 7.

Figure 6:
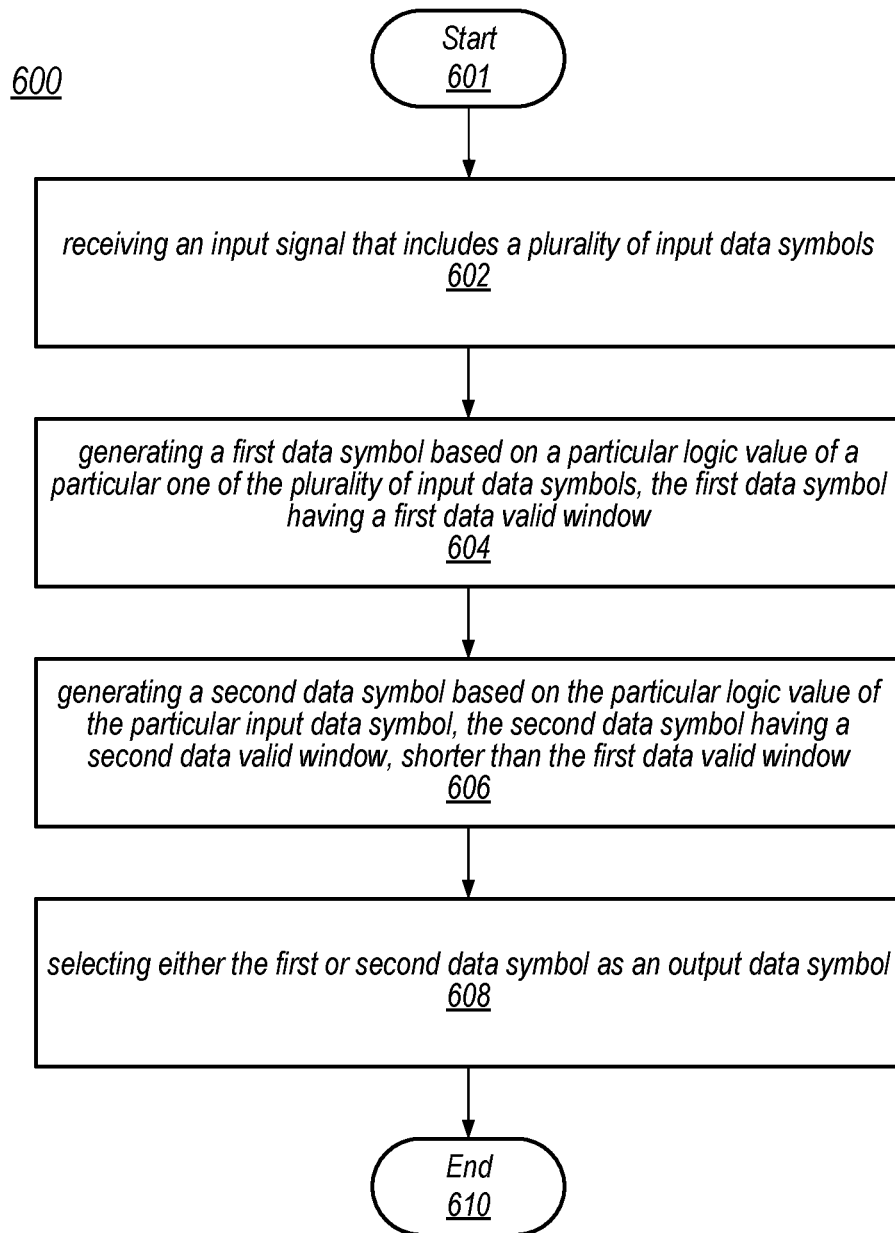
FIG. 6 illustrates a flow diagram of an embodiment of a method for operating a receiver system with two receiver circuits.

Proceeding now to FIG. 6, a flow diagram illustrating an embodiment of a method for operating a receiver system in a computing system is shown. Method 600 may be applied to a receiver system, such as receiver system 100 in FIG. 1. Referring collectively to receiver system 100 and the flow diagram in FIG. 6, method 600 begins in block 601.

First and second receiver circuits receive an input signal that includes a plurality of input data symbols (block 602). Input signal 120 is received by first receiver circuit 101 and second receiver circuit 103. Input signal 120 includes a plurality of data symbols, such as input data symbols 121*a*-121*c*, each symbol representing a particular data value determined by, for example, a voltage level of input signal 120 at a particular point in time. In some embodiments, the voltage level of input signal 120 at the particular point in time may be influenced by a voltage level of input signal 120 during a previously received one or more input data symbols 121.

The first receiver circuit generates a first data symbol based on a particular logic value of a particular one of the plurality of input data symbols, the first data symbol having a first data valid window (block 604). As illustrated, first receiver circuit 101 generates first data symbols 123*a*-123*c* based on voltages levels on input signal 120 that correspond to input data symbols 121*a*-121*c*. Each of first data symbols 123 has an associated data valid window. A duration of each data valid window for first data symbols 123 is based on a value of the corresponding input data symbol 121. As shown, data valid windows for first data symbols 123*a* and 123*c* are longer than the data valid window for first data symbol 123*b*. First receiver circuit 101 may generate the different durations for first data symbols 123 by using a particular input voltage trip point that detects one type of voltage transition earlier than another type of voltage transition.

The second receiver circuit generates a second data symbol based on the particular logic value of the particular input data symbol, the second data symbol having a second data valid window, different than the first data valid window (block 606). In a similar manner as for first receiver circuit 101, second receiver circuit 103 generates second data symbols 125*a*-125*c* based on the values of input data symbols 121. Like first receiver circuit 101, second receiver circuit 103 generates second data symbols 125 with different durations based on the data values corresponding to each of input data symbols 121. Second receiver circuit 103, however, generates second data symbol 125*b* with a longer duration than second data symbols 125*a* and 125*c*. Second receiver circuit 103 generates the different durations for second data symbols 125 by using a different input voltage trip point than first receiver circuit 101.

A decision circuit selects either the first or second data symbol as an output data symbol (block 608). As disclosed above, voltages associated with one or more previously received input data symbols 121 may influence a voltage level of a current input data symbol 121. Theses influences may reduce a data valid window of the current input data symbol 121. To compensate for the possible reduction, decision circuit 110 is configured to select a data symbol from either first receiver circuit 101 or second receiver circuit 103, using data values for the previously received input data symbols. Using these previously received values, decision circuit 110 may select a data symbol with a longer data valid window. As shown in FIG. 1, decision circuit 110 selects first data symbols 123*a* and 123*c*, along with second data symbols 125*b*, to generate corresponding output data symbols 127a-127c. Method 600 may repeat for additional input data symbols 121, and end in block 610 once there are no further data symbols.

It is noted that the method of FIG. 6 is an example. In other embodiments, one or more operations may be performed in a different order. For example, although shown as occurring in series, operations 604 and 606 may be performed in parallel.

In the description of method 600, first and second receiver circuits are disclosed as using particular trip points to generate data symbols with different data valid windows. In some embodiments, these trip points may be programmable, for example as part of a training procedure. A method for setting the trip points is disclosed below in FIG. 7.

Figure 7:
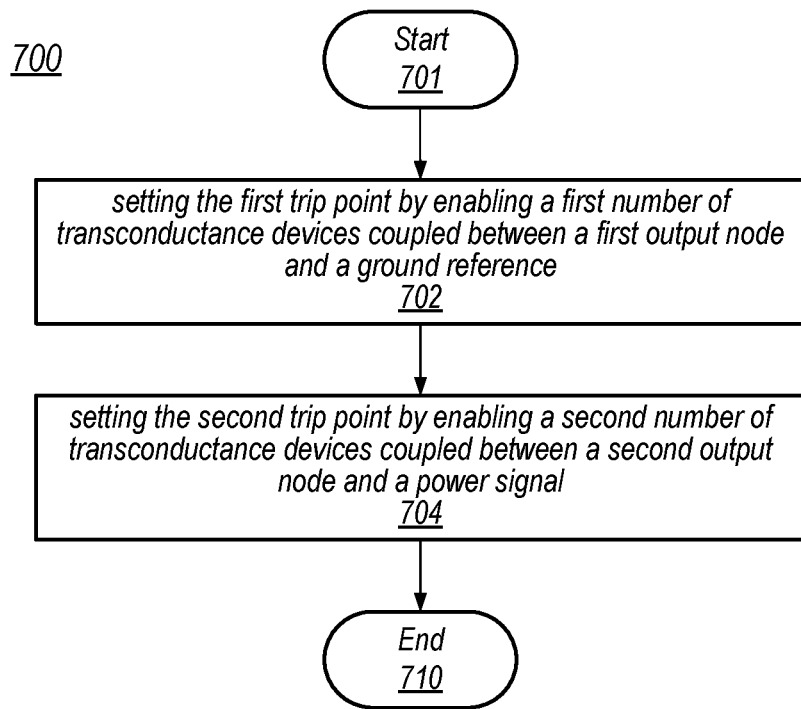
FIG. 7 shows a flow diagram of an embodiment of a method for setting an input voltage trip point for each of two receiver circuits in a receiver system.

Turning now to FIG. 7, a flow diagram for an embodiment of a method for setting voltage level trip points in a receiver circuit is depicted. Method 700 may be applied to a receiver circuit, such as first receiver circuit 101 or second receiver circuit 103 in FIG. 2, during a training operation. Referring collectively to first receiver circuit 101, computing system 500 in FIG. 5, and the flow diagram in FIG. 7, method 700 begins in block 701.

A control circuit sets a value for the first trip point by enabling a first number of transconductance devices coupled between a first output node and a ground reference node (block 702). Control circuit 515, in FIG. 5, may initiate a training operation for receiver system 100. As part of this training operation, trip points may be set for first receiver circuit 101 and second receiver circuit 103. To determine a particular setting, processing circuit 530 sends one or more memory requests to DRAM module 560, causing DRAM module 560 to send a known data pattern to receiver system 100 using input signal 120. Based on a comparison of values sampled from input signal 120 to the known data pattern, control circuit may selectively assert one or more of control signals 235 and 236.

As shown in FIG. 2, control signals 235 and 236 are coupled to control gates of transistors Q213 and Q215 of inverting stage 220. An assertion of control signal 235 results in Q213 turning on, and allowing current to flow, based on a voltage level of input signal 120, from output node 224 to a ground reference node via Q214. Asserting control signal 236 similarly opens a current path from output node 224 to the ground reference node via Q216. When both control signals 235 and 236 are de-asserted, the trip point for inverting stage 220 may be at a highest selectable setting. Asserting both control signals 235 and 236 may reduce the trip point of inverting stage 220 to a lowest selectable setting. Asserting either control signal 235 or 236, may reduce the trip point of inverting stage 220 to a setting in between the lowest and highest selectable settings.

The control circuit sets a value for the second trip point by enabling a second number of transconductance devices coupled between a second output node and a power signal (block 704). In a similar manner, control circuit 515 selects a trip point for second receiver circuit 103. As shown in FIG. 2 control signals 235 and 236 are coupled (via INVs 227 and 229) to control gates of transistors Q203 and Q205. Control signal 235, when asserted, enables current to flow through Q204 to output node 222 based on the voltage level of input signal 120. Asserting control signal 236 enables current to flow through Q206 to output node 222 based on the voltage level of input signal 120. When both control signals 235 and 236 are de-asserted, the trip point for inverting stage 210 may be at a lowest selectable setting. Asserting both control signals 235 and 236 may increase the trip point of inverting stage 210 to a highest selectable setting. Asserting either control signal 235 or 236, may reduce the trip point of inverting stage 210 to a setting in between the lowest and highest selectable settings. The method ends in block 710.

It is noted that method 700 is merely an example. In other embodiments, the operations may be performed in a different order. For example, operations 702 and 704 may be performed in parallel.

Figure 8:
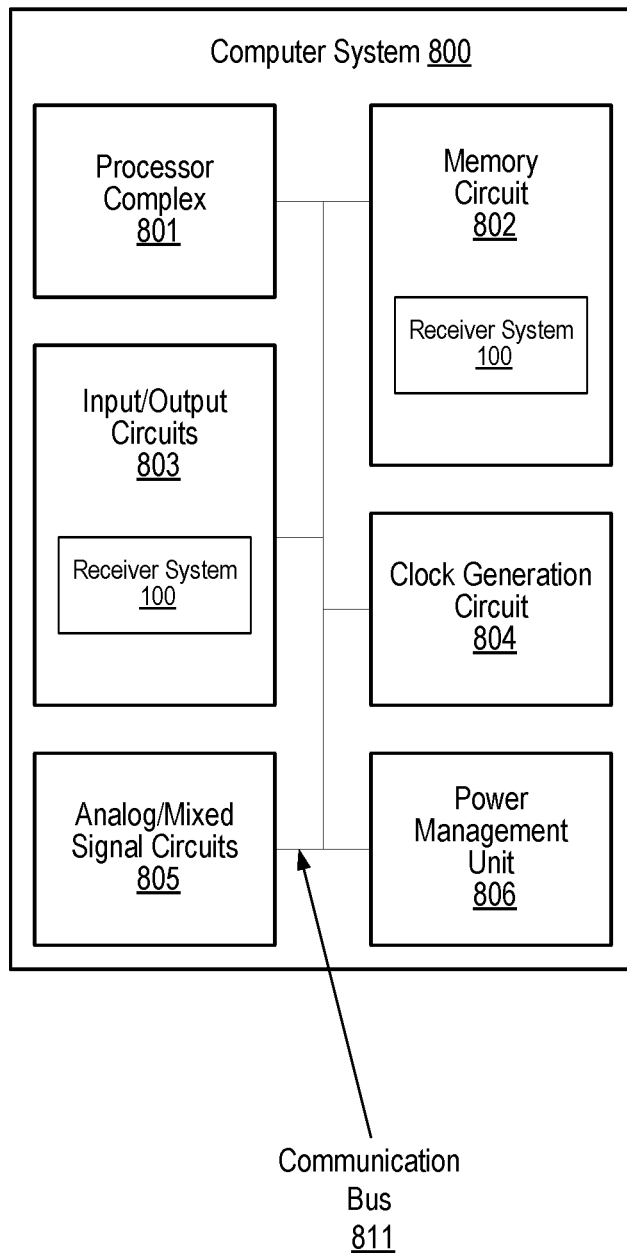
FIG. 8 depicts a block diagram of an embodiment of a computer system that includes a receiver system.

FIGS. 1-7 illustrate apparatus and methods for a receiver system in a processing system. Receiver systems, such as those described above, may be used in a variety of computer systems, such as a desktop computer, laptop computer, smartphone, tablet, wearable device, and the like. In some embodiments, the circuits described above may be implemented on a system-on-chip (SoC) or other type of integrated circuit. A block diagram illustrating an embodiment of computer system 800 that includes the disclosed circuits is illustrated in FIG. 8. As shown, computer system 800 includes processor complex 801, memory circuit 802, input/output circuits 803, clock generation circuit 804, analog/mixed-signal circuits 805, and power management unit 806. These functional circuits are coupled to each other by communication bus 811.

Processor complex 801, in various embodiments, may be representative of a general-purpose processor that performs computational operations. For example, processor complex 801 may be a central processing unit (CPU) such as a microprocessor, a microcontroller, an application-specific integrated circuit (ASIC), or a field-programmable gate array (FPGA). In some embodiments, processor complex 801 may correspond to a special purpose processing core, such as a graphics processor, audio processor, or neural processor, while in other embodiments, processor complex 801 may correspond to a general-purpose processor configured and/or programmed to perform one such function. Processor complex 801, in some embodiments, may include a plurality of general and/or special purpose processor cores as well as supporting circuits for managing, e.g., power signals, clock signals, and memory requests. In addition, processor complex 801 may include one or more levels of cache memory to fulfill memory requests issued by included processor cores.

Memory circuit 802, in the illustrated embodiment, includes one or more memory circuits for storing instructions and data to be utilized within computer system 800 by processor complex 801. In various embodiments, memory circuit 802 may include any suitable type of memory such as a dynamic random-access memory (DRAM), a static random access memory (SRAM), a read-only memory (ROM), electrically erasable programmable read-only memory (EEPROM), or a non-volatile memory, for example. It is noted that in the embodiment of computer system 800, a single memory circuit is depicted. In other embodiments, any suitable number of memory circuits may be employed. In some embodiments, memory circuit 802 may include a memory controller circuit as well communication circuits for accessing memory circuits external to computer system 800, such as a DRAM module 560 in FIG. 5. Receiver system 100 may be included as part of such communication circuits.

Input/output circuits 803 may be configured to coordinate data transfer between computer system 800 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 803 may be configured to implement a version of Universal Serial Bus (USB) protocol or IEEE 1394 (Firewire®) protocol.

Input/output circuits 803 may also be configured to coordinate data transfer between computer system 800 and one or more devices (e.g., other computing systems or integrated circuits) coupled to computer system 800 via a network. In one embodiment, input/output circuits 803 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 803 may include one or more instances of receiver system 100 to support various communication interfaces.

Clock generation circuit 804 may be configured to enable, configure and manage outputs of one or more clock sources. In various embodiments, the clock sources may be located in analog/mixed-signal circuits 805, within clock generation circuit 804, in other blocks with computer system 800, or come from a source external to computer system 800, coupled through one or more I/O pins. In some embodiments, clock generation circuit 804 may be capable of enabling and disabling (e.g., gating) a selected clock source before it is distributed throughout computer system 800. Clock generation circuit 804 may include registers for selecting an output frequency of a phase-locked loop (PLL), delay-locked loop (DLL), frequency-locked loop (FLL), or other type of circuits capable of adjusting a frequency, duty cycle, or other properties of a clock or timing signal.

Analog/mixed-signal circuits 805 may include a variety of circuits including, for example, a crystal oscillator, PLL or FLL, and a digital-to-analog converter (DAC) (all not shown) configured to generated signals used by computer system 800. In some embodiments, analog/mixed-signal circuits 805 may also include radio frequency (RF) circuits that may be configured for operation with cellular telephone networks. Analog/mixed-signal circuits 805 may include one or more circuits capable of generating a reference voltage at a particular voltage level, such as a voltage regulator or band-gap voltage reference.

Power management unit 806 may be configured to generate a regulated voltage level on a power supply signal for processor complex 801, input/output circuits 803, memory circuit 802, and other circuits in computer system 800. In various embodiments, power management unit 806 may include one or more voltage regulator circuits, such as, e.g., a buck regulator circuit, configured to generate the regulated voltage level based on an external power supply (not shown). In some embodiments any suitable number of regulated voltage levels may be generated. Additionally, power management unit 806 may include various circuits for managing distribution of one or more power signals to the various circuits in computer system 800, including maintaining and adjusting voltage levels of these power signals. Power management unit 806 may include circuits for monitoring power usage by computer system 800, including determining or estimating power usage by particular circuits.

It is noted that the embodiment illustrated in FIG. 8 includes one example of a computer system. A limited number of circuit blocks are illustrated for simplicity. In other embodiments, any suitable number and combination of circuit blocks may be included. For example, in other embodiments, security and/or cryptographic circuit blocks may be included.

Figure 9:
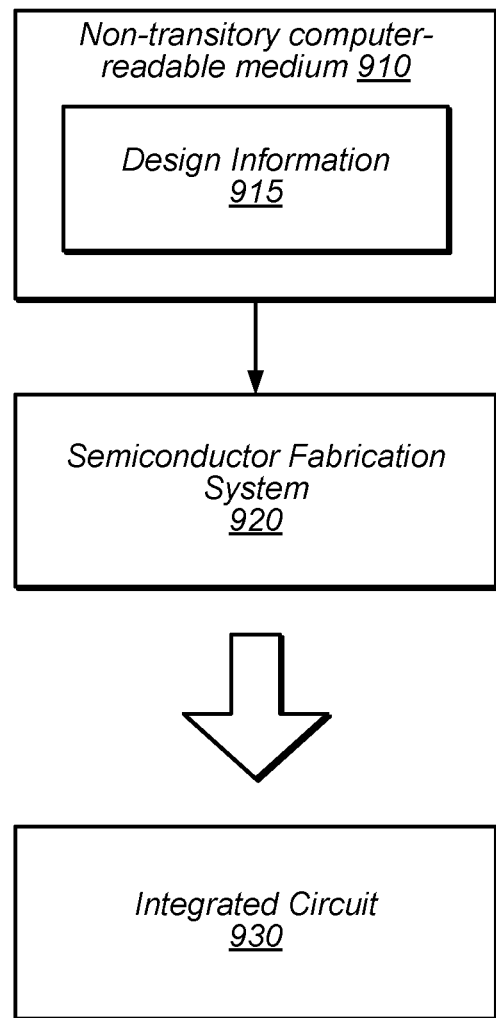
FIG. 9 illustrates a block diagram depicting an example computer-readable medium, according to some embodiments.

FIG. 9 is a block diagram illustrating an example of a non-transitory computer-readable storage medium that stores circuit design information, according to some embodiments. The embodiment of FIG. 9 may be utilized in a process to design and manufacture integrated circuits, such as, for example, an IC that includes computer system 800 of FIG. 8. In the illustrated embodiment, semiconductor fabrication system 920 is configured to process the design information 915 stored on non-transitory computer-readable storage medium 910 and fabricate integrated circuit 930 based on the design information 915.

Non-transitory computer-readable storage medium 910, may comprise any of various appropriate types of memory devices or storage devices. Non-transitory computer-readable storage medium 910 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 910 may include other types of non-transitory memory as well or combinations thereof. Non-transitory computer-readable storage medium 910 may include two or more memory mediums which may reside in different locations, e.g., in different computer systems that are connected over a network.

Design information 915 may be specified using any of various appropriate computer languages, including hardware description languages such as, without limitation: VHDL, Verilog, SystemC, SystemVerilog, RHDL, M, MyHDL, etc. Design information 915 may be usable by semiconductor fabrication system 920 to fabricate at least a portion of integrated circuit 930. The format of design information 915 may be recognized by at least one semiconductor fabrication system, such as semiconductor fabrication system 920, for example. In some embodiments, design information 915 may include a netlist that specifies elements of a cell library, as well as their connectivity. One or more cell libraries used during logic synthesis of circuits included in integrated circuit 930 may also be included in design information 915. Such cell libraries may include information indicative of device or transistor level netlists, mask design data, characterization data, and the like, of cells included in the cell library.

Integrated circuit 930 may, in various embodiments, include one or more custom macrocells, such as memories, analog or mixed-signal circuits, and the like. In such cases, design information 915 may include information related to included macrocells. Such information may include, without limitation, schematics capture database, mask design data, behavioral models, and device or transistor level netlists. As used herein, mask design data may be formatted according to graphic data system (gdsii), or any other suitable format.

Semiconductor fabrication system 920 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 920 may also be configured to perform various testing of fabricated circuits for correct operation.

In various embodiments, integrated circuit 930 is configured to operate according to a circuit design specified by design information 915, which may include performing any of the functionality described herein. For example, integrated circuit 930 may include any of various elements shown or described herein. Further, integrated circuit 930 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
a receiver circuit, including:
a first inverting stage configured to:
receive a particular input data symbol of a plurality of input data symbols included in an input signal; and
generate a complemented data symbol with a data valid window that is based on a type of transition of the particular input data symbol; and
a second inverting stage configured to:
receive the complemented data symbol from the first inverting stage; and
generate an output data symbol with a data valid window that is based on the type of transition of the particular input data symbol.

2. The apparatus of claim 1, wherein the type of transition of the particular input data symbol includes a transition from a logic low value to a logic high value.

3. The apparatus of claim 2, wherein to generate the complemented data symbol, the first inverting stage is configured to increase the data valid window of the complemented data symbol in comparison to a data valid window of the particular input data symbol, and wherein to generate the output data symbol, the second inverting stage is configured to increase the data valid window of the output data symbol in comparison to the data valid window of the particular input data symbol.

4. The apparatus of claim 1, wherein the type of transition of the particular input data symbol is a transition from a logic high value to a logic low value.

5. The apparatus of claim 4, wherein to generate the complemented data symbol, the first inverting stage is configured to decrease the data valid window of the complemented data symbol in comparison to a data valid window of the particular input data symbol, and wherein to generate the output data symbol, the second inverting stage is configured to decrease the data valid window of the complemented data symbol in comparison to the data valid window of the particular input data symbol.

6. The apparatus of claim 1, wherein to generate the complemented data symbol, the first inverting stage has a first input voltage trip point that is lower than a second input voltage trip point of the second inverting stage.

7. The apparatus of claim 6, further including a control circuit that is configured to set the first and second input voltage trip points.

8. A method comprising:
receiving, by a receiver circuit, an input signal that includes a particular input data symbol;
generating, by the receiver circuit using the particular input data symbol, a complemented data symbol with a data valid window that is based on a type or transition of the particular input data symbol; and
generating, by the receiver circuit using the complemented data symbol, an output data symbol with a data valid window that is based on the type of transition of the particular input data symbol.

9. The method of claim 8, wherein the type of transition of the particular input data symbol includes a rising transition from a logic low value to a logic high value and a subsequent falling transition from the logic high value to the logic low value.

10. The method of claim 9, further comprising:
generating the complemented data symbol by increasing the data valid window of the complemented data symbol in comparison to a data valid window of the particular input data symbol; and
generating the output data symbol by increasing the data valid window of the output data symbol in comparison to the data valid window of the particular input data symbol.

11. The method of claim 9, further comprising detecting the rising transition of the particular input data symbol in less amount of time than used to detect the falling transition of the particular input data symbol.

12. The method of claim 11, further comprising detecting a falling transition of the complemented data symbol in less amount of time than is used to detect a rising transition of the complemented data symbol.

13. The method of claim 12, further comprising:
generating the complemented data symbol by comparing the particular input data symbol to a first input voltage trip point; and
generating the output data symbol by comparing the complemented data symbol to a second input voltage trip point that is higher than the first input voltage trip point.

14. An apparatus, comprising:
a receiver circuit, including:
a first inverting stage configured to generate a particular logic voltage level on a first output node based on a comparison of a voltage level of an input node to a first input voltage trip point; and a second inverting stage configured to generate a different logic voltage level on a second output node based on a comparison of the particular logic voltage level of the first output node to a second input voltage trip point, different than the first input voltage trip point.

15. The apparatus of claim 14, wherein the first inverting stage includes a plurality of transconductance devices coupled between the first output node and a ground reference node.

16. The apparatus of claim 15, further comprising a control circuit configured to selectively enable and disable ones of the plurality of transconductance devices to set the first input voltage trip point.

17. The apparatus of claim 16, wherein the control circuit is further configured to lower the first input voltage trip point by enabling one or more of the plurality of transconductance devices.

18. The apparatus of claim 14, wherein the second inverting stage includes a plurality of transconductance devices coupled between the second output node and a power node.

19. The apparatus of claim 18, further comprising a control circuit configured to selectively enable ones of the plurality of transconductance devices to raise the second input voltage trip point.

20. The apparatus of claim 19, wherein to selectively enable ones of the plurality of transconductance devices, the control circuit is further configured to:
   initiate a training operation; and
   expect a particular data pattern on the input node.

* * * * *